United States Patent
Dennard et al.

(10) Patent No.: US 10,439,046 B1
(45) Date of Patent: Oct. 8, 2019

(54) STRUCTURE AND METHOD FOR IMPROVING ACCESS RESISTANCE IN U-CHANNEL ETSOI

(71) Applicant: International Business Machines Corporation, Armonk, NY (US)

(72) Inventors: Robert H. Dennard, Croton-on-Hudson, NY (US); Rajiv V. Joshi, Yorktown Heights, NY (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/921,776

(22) Filed: Mar. 15, 2018

(51) Int. Cl.
*H01L 29/66* (2006.01)
*H01L 29/06* (2006.01)
*H01L 29/786* (2006.01)
*H01L 21/285* (2006.01)
*H01L 29/423* (2006.01)
*H01L 29/16* (2006.01)

(52) U.S. Cl.
CPC .. *H01L 29/66742* (2013.01); *H01L 21/28562* (2013.01); *H01L 29/0607* (2013.01); *H01L 29/1608* (2013.01); *H01L 29/4236* (2013.01); *H01L 29/66545* (2013.01); *H01L 29/78696* (2013.01)

(58) Field of Classification Search
CPC .......... H01L 29/66742; H01L 29/1608; H01L 29/4236; H01L 29/66545; H01L 29/78696; H01L 21/28562
See application file for complete search history.

(56) References Cited

U.S. PATENT DOCUMENTS

| | | |
|---|---|---|
| 5,071,788 A | 12/1991 | Joshi |
| 5,084,417 A | 1/1992 | Joshi |
| 5,907,789 A | 5/1999 | Komatsu |
| 6,333,250 B1 | 12/2001 | Kim |
| 7,476,932 B2 | 1/2009 | Zhang et al. |
| 7,994,049 B2 | 8/2011 | Futase |
| 8,975,142 B2 | 3/2015 | Paul et al. |

(Continued)

OTHER PUBLICATIONS

Y. C. Jang et al., "Structural and electrical characteristics of chemical vapor deposited W/n-Si0.83Ge0.17/Si (001) and chemical vapor deposited WSix/n-Si0.83Ge0.17/Si (001)," Journal of Vacuum Science & Technology A, vol. 19, No. 4, 2001, pp. 1046-1051.

*Primary Examiner* — Julia Slutsker
(74) *Attorney, Agent, or Firm* — Eric K. Johnson (57) ABSTRACT

The present invention provides for a method of fabricating a semiconductor device, the method includes depositing a nitride layer on an ETSOI layer; forming a dummy gate over the nitride layer; forming nitride gate spacers from the nitride layer; growing a sacrificial layer on the ETSOI layer, the sacrificial layer composing a material that can be at least partially converted to a metal layer by a metal-bearing gas; forming refractory metal contacts using the sacrificial layer and a consumptive process; depositing an oxide protect layer on the refractory metal contacts; removing the dummy gate using a mask and etch process combined with chemical-mechanical polishing (CMP); etching the ETSOI layer to form a U-shaped channel; and depositing the final gate stack into the U-shaped channel.

10 Claims, 6 Drawing Sheets

(56) References Cited

U.S. PATENT DOCUMENTS

| | | |
|---|---|---|
| 9,219,009 B2 | 12/2015 | Lai et al. |
| 9,548,366 B1* | 1/2017 | Ho ..................... H01L 29/6656 |
| 2002/0090796 A1* | 7/2002 | Desai ................ H01L 21/76843 |
| | | 438/430 |
| 2013/0157450 A1* | 6/2013 | Fitz ................... H01L 21/76897 |
| | | 438/586 |
| 2013/0189833 A1* | 7/2013 | Baars ................ H01L 21/76897 |
| | | 438/586 |
| 2014/0103405 A1 | 4/2014 | Chang et al. |
| 2016/0247888 A1* | 8/2016 | Kerber .............. H01L 29/66545 |

\* cited by examiner

STRUCTURE AND METHOD FOR IMPROVING ACCESS RESISTANCE IN U-CHANNEL ETSOI

FIELD OF THE INVENTION

The present invention relates to a structure and method for improving access resistance in U-channel extremely-thin semiconductor-on-insulator (U-channel ETSOI). More particularly, the present invention relates to a structure and method for improving access resistance in U-channel ETSOI using metal refractory metal contacts.

BACKGROUND

In the manufacturing of semiconductor devices, there is a continuing drive to increase device density on the semiconductor chips in order to increase the resulting operating speeds of the device. As semiconductor technologies scale to support higher chip density, Middle of Line (MOL) connections such as stud contacts become narrower, and thus become more resistive. These higher resistances lead to a significant degradation in chip performance. MOL semiconductor processing techniques create structures that electrically connect an intrinsic semiconductor device, such as a metal-oxide-semiconductor-field effect transistor MOS-FET), with Back-End-of-Line (BEOL) chip wiring. It is therefore imperative that improved MOL processes and structures be utilized that do not suffer the same shortcomings as those found today.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices and methods fabricating a semiconductor device for improving access resistance in U-channel ETSOI using metal refractory metal contacts are described.

According to an embodiment, a method of fabricating a semiconductor device is provided. The method can comprise depositing a nitride layer on an ETSOI layer and forming a dummy gate over the nitride layer. The method can further comprise forming nitride gate spacers from the nitride layer and growing a sacrificial layer on the ETSOI layer, where the sacrificial layer composing a material that can be at least partially converted to a metal layer by a metal-bearing gas. The method can further comprise forming refractory metal contacts using the sacrificial layer and a consumptive process. Further, the method can comprise depositing an oxide protect layer on the refractory metal contacts and removing the dummy gate using a mask and etch process combined with chemical-mechanical polishing (CMP). Moreover, the method can comprise etching the ETSOI layer to form a U-shaped channel; and depositing the final gate stack into the U-shaped channel.

According to another embodiment, a semiconductor device is provided. The semiconductor device can comprise an ETSOI layer, a dielectric layer located on top of the ETSOI layer, a cavity located in the dielectric layer, and gate spacers positioned adjacently to a portion of the cavity. The semiconductor device can further comprise a source region and a drain region, where the source region and the drain region are at least partially positioned adjacently to a portion of the cavity. Further, the semiconductor device can comprise refractory metal contacts positioned over the source region and the drain region, an oxide protect layer located on top of the refractory metal contacts, and a final gate stack located inside the cavity.

According to another embodiment, a method of fabricating a semiconductor device is provided. The method can comprise depositing an ETSOI layer and growing a sacrificial layer on the ETSOI layer, where the sacrificial layer composing a material that can be at least partially converted to a metal layer by a metal-bearing gas. The method can further comprise forming a source region and a drain region from the sacrificial layer, forming a refractory metal layer using the sacrificial layer and a consumptive process, and depositing a thick oxide hard mask layer on top of the ETSOI layer. The method can further comprise forming a dummy gate on the top of the ETSOI layer, depositing a nitride layer over the source region and the drain region to form gate spacers, and depositing an oxide protect layer on the refractory metal contacts and using chemical-mechanical polishing (CMP) to expose the dummy gate. Moreover, the method can comprise removing the dummy gate and leaving a cavity and removing the oxide protect layer and dummy gate dielectric layer to expose the source region and the drain region contacts.

BRIEF DESCRIPTION OF THE DRAWINGS

Embodiments will be described in more detail in conjunction with the accompanying drawings, in which.

DETAILED DESCRIPTION OF THE PREFERRED EMBODIMENTS

It is understood in advance that, although this detailed description includes a description of improving access resistance in U-channel extremely-thin semiconductor-on-insulator (U-channel ETSOI), implementation of the teachings recited herein are not necessarily limited to a particular type of process or device structure. Rather embodiments of the present invention are capable of being implemented in conjunction with any other type of process or device structure, now known or later developed.

Various embodiments of the present invention are described herein with reference to the related drawings in the figures. The figures are intended for illustrative purposes and, as such, are not necessarily drawn to scale. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the described embodiments of the present invention are not intended to be limiting in this respect. Accordingly, a coupling of entities can refer to either a direct or an indirect coupling, and a positional relationship between entities can be a direct or indirect positional relationship. As an example of an indirect positional relationship, references in the detailed description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (i.e., rotated 90 degrees or at other orientations), and the spatially relative descriptors used herein should be interpreted accordingly.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of aspects of the present invention, embodiments of the invention provide a novel device structure for a U-channel extremely-thin semiconductor-on-insulator (ETSOI) transistor with high performance and low resistance refractory metal contacts and a method to fabricate therefore. Typically, Middle of Line (MOL) semiconductor process steps create structures that electrically connect intrinsic semiconductor devices such as a metal-oxide-semiconductor field-effect transistor (MOSFET) with Back-End-of-Line (BEOL) chip wiring. As semiconductor technologies scale to support higher chip density, MOL connections such as stud contacts become narrower and narrower, thus becoming highly resistive. This higher resistance leads to a degradation in chip performance. Semiconductor technologies have already seen the impact of high MOL resistance at 20 and 22 nanometers. Super-scaled technologies such as 5 and 7 nanometers will be dominated by MOL resistance and a solution is urgently needed. The present invention introduces a process and method for introducing refractory metal contacts compatible with U-channel ETSOI processes. This allows for a low resistance, cost-effective, and self-limiting process that is compatible with current and future semiconductor processes.

The present invention increases the benefits of U-channel ETSOI technology by incorporating high performance refractory metal contacts into the designs. U-channel ETSOI offers high-performance transistors for future node technologies and can typically have an ETSOI top semiconductor layer thickness of approximately 5-10 nm. ETSOI transistors have desirable power-leakage characteristics as well as an adjustable threshold control for power switching and can support localized macro frequency control.

Refractory metal contacts, such as tungsten stud contacts, have one of the highest conductivities available in semiconductor metallurgy and can be formed under a range of process conditions. The stud contact process includes a sacrificial material that is chemically replaced by the desired metallurgy during the formation of the contact. The consumption can be partial or complete, where the progress of the process can be determined by the concentration of the reaction products and the process conditions, such as gas temperature, gas pressure, and process time. If the sacrificial layer is a material such as silicon germanium, and is doped with either phosphorous, arsenic, or boron, the refractory metal contacts may retain the dopants and can be further driven into the partially sacrificial silicon germanium and the top semiconductor layer of the ETSOI wafer.

This process can partially or fully convert the sacrificial silicon germanium layer into a metal layer. To lower external resistance, selective source-drain metallization can be achieved by the following chemical reaction: $4WF_6 + 3SiGe \rightarrow 4\ W + 3SiF_4 + 3GeF_4$. This can be a self-limiting reaction at low pressures and at high pressures, where the thickness can be adjusted to produce low resistance.

The cross-sectional views of the U-channel extremely-thin semiconductor-on-insulator (ETSOI) transistor and flowchart diagrams in the figures illustrate the architecture, functionality, and operation of possible implementations of systems and methods according to various embodiments of the present invention. In some alternative implementations, the functions noted in the block may occur out of the order noted in the figures. For example, two blocks shown in succession may, in fact, be executed concurrently, or the blocks may sometimes be executed in the reverse order, depending upon the functionality involved.

Figure 1:
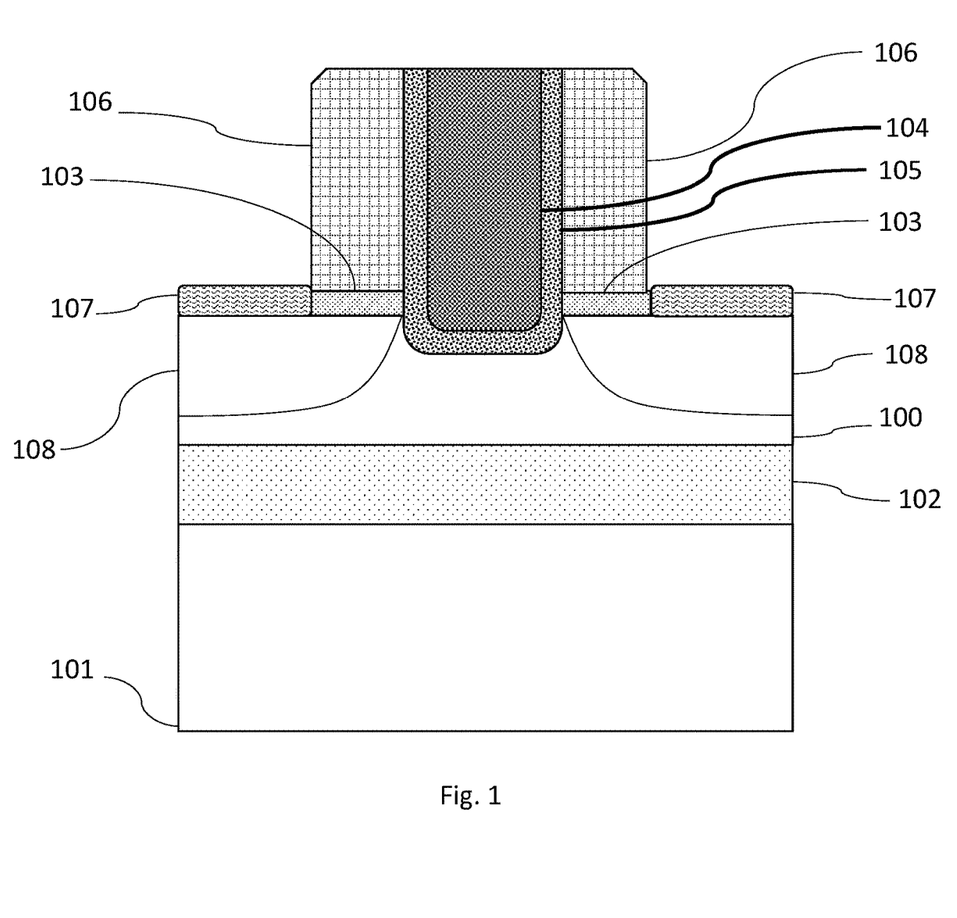
FIG. 1 illustrates a diagram of a U-channel extremely-thin semiconductor-on-insulator (ETSOI) transistor with high performance and low resistance refractory metal contacts.

FIG. 1 illustrates a cross-sectional view of a U-channel extremely-thin semiconductor-on-insulator (ETSOI) transistor with high performance and low resistance refractory metal contacts, where 100 refers to the ETSOI top semiconductor layer, 101 refers to the ETSOI wafer, 102 refers to the buried oxide layer, 103 refers to the dummy gate dielectric layer, 104 refers to the gate metals, 105 refers to the gate dielectrics, 106 refers to the gate spacers, 107 refers to the refractory metal contacts, and 108 refers to the source/drain diffusion regions.

The ETSOI wafer 101 can be composed of any type of semiconductor material, such as single crystalline silicon, sapphire, etc. The buried oxide layer 102, is composed of an insulating material, such as silicon dioxide. The ETSOI top semiconductor layer 100 can be composed of any type of semiconductor material. In some applications, the choice of semiconductor material for the ETSOI top semiconductor layer 100 can be composed of a heterostructure semiconductor material such as silicon germanium or silicon carbide.

The dummy gate dielectric layer 103 is deposited onto the top semiconductor layer 100. The dummy gate dielectric layer 103 can be composed of a silicon dioxide or silicon nitride layer. The deposition of the dummy gate dielectric can be achieved through any number of well-known thin film deposition techniques, such as through chemical vapor deposition, plasma deposition, sputtering, spin coating, etc.

After deposition of the dummy gate dielectric layer 103, a dummy gate mask is formed by first depositing a masking dielectric material. The masking dielectric material is preferably composed of a high-k dielectric material. High-k dielectrics are used in semiconductor manufacturing processes where they can replace a silicon dioxide gate dielectric. Replacing the silicon dioxide gate dielectric with a high-k material allows for increased gate capacitance without any associated leakage effects. High-k materials that can be used for the masking dielectric material include, but are not limited to, hafnium silicate, zirconium silicate, hafnium dioxide, and zirconium dioxide. These high-k materials are typically deposited using atomic layer deposition. Using standard thin film processing techniques known in the art, a sacrificial masking layer, such as a photoresist, is then applied on top of the masking dielectric material and patterned. Using standard thin film processing techniques known in the art, such as wet chemical etching or reactive ion etching, a cavity defined by the sacrificial masking layer's pattern is etched into the masking dielectric material down to the dummy gate dielectric layer 103. The patterned sacrificial masking layer is then removed prior to patterning the dummy gate mask using standard thin film processing techniques known in the art, such as through solvent washes or through reactive oxygen plasma treatments.

Once the patterned sacrificial masking layer is removed, a conductive material is deposited over the masking dielectric material, such that the conductive material fills the etched cavity and covers the top surface of the masking dielectric material. The conductive material can be deposited through any number of commonly known thin film deposition techniques, such as chemical vapor deposition, plasma deposition, sputtering, spin coating, etc. The conductive material can be composed of polysilicon although alternative combinations of oxides, nitrides, and silicon material, such as amorphous silicon, can be used by substituting these materials in the appropriate places using standard processing techniques known to one skilled in the art. These standard processing techniques can include wet etching, dry etching, simultaneous etch and deposition, spin coating, low-pressure chemical vapor deposition (LPCVD), and chemical-mechanical polishing. These techniques are used to planarize the conductive material deposited over the masking dielectric material, such that only the conductive material in the etched cavity remains. This remaining conductive material forms a dummy gate.

Using standard techniques known in the art, such as wet chemical etching or reactive ion etching, the dielectric layer 103 and the masking dielectric material is then etched (removed) around the dummy gate. The dielectric layer can also be a thick oxide layer. Additionally, other dummy gate formation techniques can be used such as conventional mask/lithography/etch with the appropriate semiconductor fabrication tools, and that other mask techniques such as sidewall image transfer (SIT) can be used for making highly-scaled gate lengths.

Gate spacers 106 are formed by first depositing a dielectric layer, such as silicon nitride, over the ETSOI top semiconductor layer 100 and the dummy gate, and then masking/etching the deposited dielectric layer appropriately using known thin film patterning techniques. The source region and the drain regions 108, are then formed in the ETSOI top semiconductor layer 100 using standard semiconductor device processing techniques that are known in the art such as photolithography, ion implantation, dry etching, wet etching, thermal treatments, chemical vapor deposition, chemical-mechanical planarization, molecular beam epitaxy, physical vapor deposition, etc.

In order to form the refractory metal contacts 107, a sacrificial layer is partially converted to a metal layer through a reaction with a metal-bearing gas. The sacrificial layer can be a conductive heterostructure material. This conductive heterostructure material can be silicon germanium or silicon carbide, preferably silicon germanium. The conductive heterostructure material is deposited and patterned on top of the source region and drain regions 108 using standard thin film processing techniques that are known in the art, such as photolithography and etching. The metal-bearing gas can use a metal such as tungsten, aluminum, copper, molybdenum, tantalum, titanium, and nickel. Tungsten hexafluoride is currently the preferred material used for chemical vapor deposition (CVD). Tungsten is preferred because of its high thermal and chemical stability as well as low resistivity. Hexafluoride is preferred because of its high vapor pressure resulting in higher deposition rates. Hexafluoride can be split up by a CVD process. The decomposition is done by mixing hexafluoride with compounds such as hydrogen, silane, germane, diborane, phosphine, and related hydrogen containing gases.

The refractory metal contacts 107, which serves as the source and drain contact metals, are formed in one embodiment by a process where there is partial consumption of the sacrificial layer. The consumptive process is initiated by the presence of a metal-bearing gas under suitable process conditions. The refractory metal contacts 107 are then formed and the sacrificial layer is consumed. In another embodiment, the refractory metal contacts 107 can be formed through complete consumption of the sacrificial layer. The refractory metal contacts 107 can also be non-planar. In other words, the refractory metal contacts 107 can be a raised source or drain shaped like an upward bulge or a cavity. The refractory metal contacts 107 can be selected from the following group: tungsten, tantalum, platinum, molybdenum, iridium, and niobium, or combinations thereof.

A drive-in anneal process can be applied for activating the diffusions after the source region and the drain regions 108 are formed and prior to forming the refractory metal contacts 107. Chemical sensors that monitor the formation of the refractory metal contacts 107 can be used in order to measure the concentration, partial pressure, and the amount of the reaction products formed during sacrificial layer consumptive process. For example, chemical sensors tuned to recognize gaseous $SiF_4$ or $GeF_4$ concentration can be used as a way of determining when a desired tungsten layer thickness has been formed.

After formation of the refractory metal contacts 107, an oxide protect layer can be deposited over the refractory metal contacts 107, gate spacers 106 and dummy gate. The oxide protect layer can be composed of silicon dioxide, silicon nitride, or any other dielectric material, and can be deposited through any number of well-known thin film deposition techniques, such as through chemical vapor deposition, plasma deposition, sputtering, spin coating, etc. A CMP step can then be applied to planarize the deposited oxide protect layer, so as to expose the top of the dummy gate.

In order to form the final gate stack, which can be composed of the gate metal 104 and the gate dielectric 105, the dummy gate is first removed in order to expose a cavity whose sidewalls are composed of the gate spacer 106. Removing the dummy gate can be achieved through any number of well-known thin film etching techniques, such as through a reactive-ion etch (RIE) process that anisotropically etches preferentially in the vertical direction and/or through a wet etch. Optional doping in the cavity and the resulting optional dopant between the ETSOI top semiconductor layer 100, the source region and the drain region 108, and ETSOI buried oxide layer 102 can be achieved through any number of well-known semiconductor processing techniques known in the art. For example, the optional channel dopant can be introduced using ion implantation, gaseous diffusion, or other techniques.

The final gate stack includes gate dielectric 105 and gate metal 104 deposited into the cavity. The gate dielectrics 105 can be deposited and patterned using any number of well-known thin film processing techniques, such as through patterning a thin film deposited by chemical vapor deposition, plasma deposition, sputtering, spin coating, etc. Likewise, the gate metal 104 can be deposited and patterned using any number of well-known thin film processing techniques, such as patterning a thin film deposited by thermal evaporation, electron-beam evaporation, sputtering, etc. The gate dielectric 105 and gate metal 104 can be selected from a host of well-known semiconductor device materials known in the art to achieve the target transistor threshold voltage.

Figure 2:
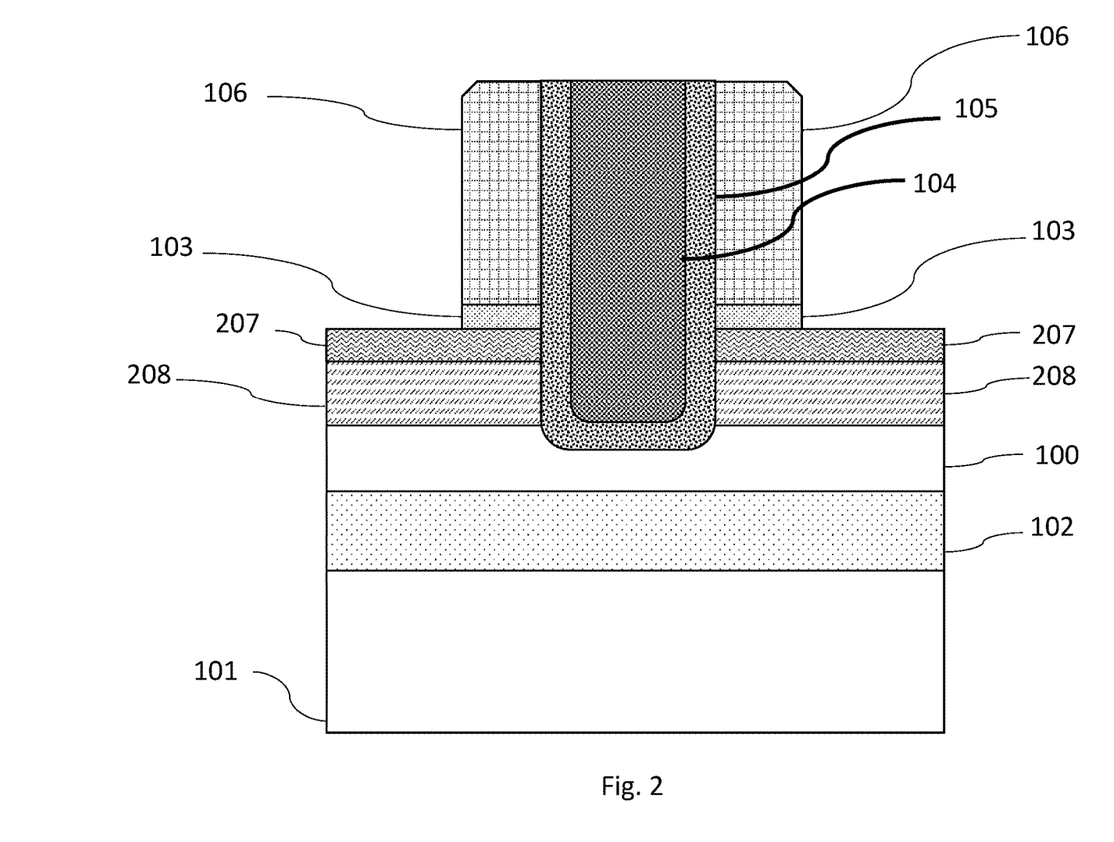
FIG. 2 illustrates a diagram of an alternative embodiment of a U-channel extremely-thin semiconductor-on-insulator (ETSOI) transistor with high performance and low resistance refractory metal contacts.

FIG. 2 illustrates a cross-sectional view of an alternative U-channel extremely-thin semiconductor-on-insulator (ETSOI) transistor with high performance and low resistance refractory metal contacts. A cross-sectional view of an initial stack of materials is illustrated, including a ETSOI top semiconductor layer 100, ETSOI wafer 101, and buried oxide layer 102. The ETSOI wafer 101 can be composed of any type of semiconductor material, such as single crystalline silicon, sapphire, etc. The buried oxide layer 102, is composed of an insulating material, such as silicon dioxide. The ETSOI top semiconductor layer 100 can be composed of any type of semiconductor material. In some applications, the choice of semiconductor material for the ETSOI top semiconductor layer 100 can be composed of a heterostructure semiconductor material such as silicon germanium or silicon carbide.

A source region and a drain region with dopant 208 is introduced in the ETSOI top semiconductor layer 100. The epitaxially grown sacrificial layer is deposited on top of the ETSOI top semiconductor layer 100. The sacrificial layer can be a conductive heterostructure material. Preferably the conductive heterostructure material can be silicon germanium or silicon carbide.

The refractory metal contacts 207 are formed by a tungsten hexafluoride process on the epitaxially-grown sacrificial layer when consumption of the sacrificial layer is taken to completion. There are multiple ways to form the refractory metal contacts 207. One technique is blanket diffusion into the silicon above the buried oxide layer 102 using conventional implantation techniques. This will create a vertically graded layer with a profile that depends on the thickness of the ETSOI top semiconductor layer 100 and the doping conditions. Using an etching technique, the U-channel shaped cavity is created to go past the source region and the drain region with dopant 208 and into the ETSOI top semiconductor layer 100. Another method is to create an epitaxial layer through techniques such as vapor phase or liquid phase or other known techniques that uses the existing exposed silicon as a seed layer. This epitaxial layer should be doped and could optionally include column IV elements such as germanium and carbon to induce strain. The refractory metal contacts 207 can also be non-planar such as in a cavity shaped or shaped like an upward bulge, e.g. a raised source or a raised drain. The refractory metal contacts 207 can be selected from the following group: tungsten, tantalum, platinum, molybdenum, iridium, and niobium. A drive-in anneal can be applied for the diffusions after the source region and the drain region 208 are formed and prior to forming the refractory metal contacts 207. The concentration, partial pressure, and the amount of the reaction products formed during the sacrificial layer consumptive process can be monitored through chemical sensors in order to determine the extent of the formation of the refractory metal contacts 207.

A dummy gate dielectric layer 103 is deposited on top of the ETSOI top semiconductor layer 100. A dielectric layer is deposited on top of the dummy gate dielectric layer 103 and a cavity is etched in the dielectric layer. The dummy gate dielectric layer 103 can be a silicon dioxide or silicon nitride layer. The deposition of the dummy gate dielectric layer 103 can be achieved through any number of well-known thin film deposition techniques, such as through chemical vapor deposition, plasma deposition, sputtering, spin coating, etc. The dummy gate can be a polysilicon although alternative combinations of oxides, nitrides, and silicon material such as amorphous silicon can be used by substituting these materials in the appropriate places in the process as will be apparent to one skilled in the art.

Next, a dielectric layer is etched around the dummy gate. The dielectric layer is an electrical insulator that can be polarized by an applied electric field. The material should preferably be a high-k dielectric material over the dummy gate dielectric layer 103. High-k dielectrics are used in semiconductor manufacturing processes where they can replace a silicon dioxide gate dielectric. High-k dielectrics are vital as a result of the decreased size of transistors. Replacing the silicon dioxide gate dielectric with a high-k material allows for increased gate capacitance without any associated leakage effects. High-k materials used can include hafnium silicate, zirconium silicate, hafnium dioxide, and zirconium dioxide, typically deposited using atomic layer deposition. Using standard thin film processing techniques known in the art, a sacrificial masking layer, such as a photoresist, is then applied on top of the masking dielectric material and patterned. Using standard thin film processing techniques known in the art such as wet chemical etching or reactive ion etching, a cavity defined by the sacrificial masking layer's pattern is etched into the masking dielectric material down to the dummy gate dielectric layer 103. The patterned sacrificial masking layer is then removed prior to patterning the dummy gate mask using standard thin film processing techniques known in the art, such as through solvent washes or through reactive oxygen plasma treatments.

A variety of dummy gate formation techniques can be used such as conventional mask/lithography/etch with the appropriate semiconductor fabrication tools, and that other mask techniques such as sidewall image transfer (SIT) can be used for making highly-scaled gate lengths. Gate spacers 106 can be formed by depositing a dielectric layer, such as silicon nitride on top of the dummy gate dielectric layer 103.

Then, the dummy gate can anisotropically etch the just-deposited nitride layer. Next, an oxide protect layer is deposited on top of the dummy gate dielectric layer 103 and gate spacers 106 and planarizing the top surface.

Next, a cavity for the final gate stack is formed by removing the dummy gate. A multistep etch process, e.g., dry and wet etch processes may be used to form the final cavity for the gate stack. Finally, a final gate stack including gate dielectrics 105 and gate metals 104 deposited into the cavity, and the oxide protect layer is removed. For example, in a replacement metal gate (RMG) process, a thin nfet or pfet work function metal layer is first deposited in the final gate stack cavity which can be followed by a chemical-mechanical polish to remove any excess work-function metal layer, followed by deposition of a low-resistance contact metal such as tungsten, followed by a second chemical-mechanical polish to remove the excess contact metal layer.

Figure 3:
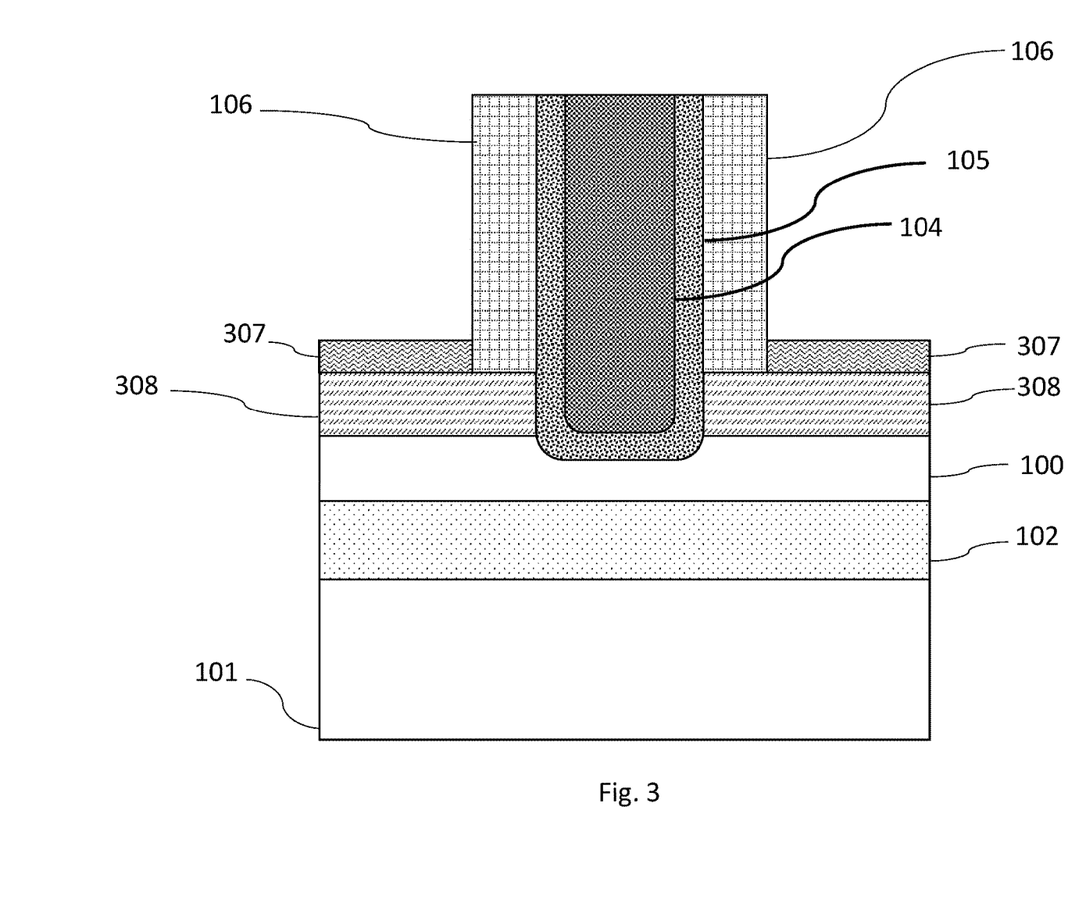
FIG. 3 illustrates a diagram of another alternative embodiment of a U-channel extremely-thin semiconductor-on-insulator (ETSOI) transistor with high performance and low resistance refractory metal contacts.

FIG. 3 illustrates a cross-sectional view of another alternative U-channel extremely-thin semiconductor-on-insulator (ETSOI) transistor with high performance and low resistance refractory metal contacts. A cross-sectional view of an initial stack of materials is illustrated, including an ETSOI top semiconductor layer 100, ETSOI wafer 101, and buried oxide layer 102. The ETSOI wafer 101 can be composed of any type of semiconductor material, such as single crystalline silicon, sapphire, etc. The buried oxide layer 102, can be composed of any insulating material, such as silicon dioxide. The ETSOI top semiconductor layer 100 can be a heterostructure material such as silicon germanium, silicon carbide, or other semiconductor materials.

A source region and a drain region with dopant 308 is formed in the ETSOI top semiconductor layer 100 prior to the process step of epitaxially growing sacrificial layer and the forming of the refractory metal contact layer 307. The sacrificial layer can be a conductive heterostructure material. This conductive heterostructure material can be silicon germanium or silicon carbide. An epitaxially-grown sacrificial layer is deposited on top of the ETSOI top semiconductor layer 100. The sacrificial layer can be formed e.g., non-selectively using chemical vapor deposition, e.g., low-pressure chemical vapor deposition (LPCVD) or plasma-enhanced chemical vapor deposition (PECVD) using techniques known in the art. Preferably the epitaxially-grown layer is silicon germanium.

The refractory metal contact layer 307 is formed by a tungsten hexafluoride process on the epitaxially-grown sacrificial layer. As previously noted, there are multiple ways to form the refractory metal contacts 307. One method is blanket diffusion into the silicon above the buried oxide layer 102 using conventional implantation techniques. This will create a vertically graded layer with a profile that depends on the thickness of the ETSOI top semiconductor layer 100 and the doping conditions. Using an etching technique, the U-channel shaped cavity is created to go past the source region and the drain region with dopant 308 and into the ETSOI top semiconductor layer 100. Another method is to create an epitaxial layer through techniques such as vapor phase or liquid phase or other known techniques that uses the existing exposed silicon as a seed layer. This epitaxial layer should be doped and could optionally include column IV elements such as germanium and carbon to induce strain. The refractory metal contacts 307 can also be non-planar such as cavity shaped or shaped like an upward bulge, in other words a raised source or a raised drain. The refractory metal contacts 307 can be selected from the following group: tungsten, tantalum, platinum, molybdenum, iridium, and niobium.

A drive-in anneal can be applied to activate the diffusion layer after the source region and the drain region 308 is formed and prior to forming the refractory metal contact layer 307. The concentration, partial pressure, and the amount of the reaction products formed during sacrificial layer consumptive process can be chemical monitors for the formation of the refractory metal contacts 307. A dummy gate dielectric layer is deposited on top of the ETSOI wafer 101 and a dielectric layer is deposited on top of the dummy gate dielectric layer. The dielectric layer can be a thick oxide layer.

A wide cavity can be etched in the dielectric layer, where the width of the wide cavity is wider than the final gate. The dummy gate dielectric layer can be a nitride layer. A variety of dummy gate formation techniques can be used such as conventional mask/lithography/etch with the appropriate semiconductor fabrication tools, and other mask techniques such as sidewall image transfer (SIT) can be used for making highly-scaled gate lengths. Next, dummy gate spacers 106 are formed on the inside walls of the cavity. The cavity is wider than in the previous embodiment for the same gate length because the cavity must accommodate the dummy gate spacer 106 formation. Then, the dummy gate is formed in the cavity where the depth of the cavity can extend past the source region and the drain region with dopant layer 308. The dummy gate can be a polysilicon although alternative combinations of oxides, nitrides, and silicon material such as amorphous silicon can be used by substituting these materials in the appropriate places in the process as will be apparent to one skilled in the art.

The dummy gate spacers 106 are removed to expose the dummy gate dielectric layer. The dummy gate spacers 106 can be removed using any number of well-known thin film etching techniques, such as through a reactive-ion etch (RIE) process that anisotropically etches preferentially in the vertical direction and/or through a wet etch. Then, the dummy gate dielectric layer is removed and the refractory metal layer 307 are now directly below where the dummy gate spacers 106 used to be.

The next step that is performed is etching the dielectric layer hard mask. Then, a material for a final spacer layer is deposited over the dummy gate, source region and drain region 308, and the small etch pits are formed. Also, an anisotropic etch is performed to complete the formation of the final gate spacers. It is understood that this spacer formation process may not by design fill all gaps (such as the etch pits) and that gaps such as these can be a desirable electrical property of this structure. A cavity is formed for the final gate stack by removing the dummy gate that can extend through the source-drain dopant layer 308. A multi-step etch process, e.g., dry and wet etch processes may be used to form the final cavity for the gate stack. Optional doping in the cavity and an optional channel dopant between the ETSOI top semiconductor layer 100 and the source region and the drain region with dopant layer 308 can be performed. Then, forming a final gate stack including gate dielectrics 105 and gate metals 104 is deposited into the cavity in addition to the removal of the oxide protect layer.

Figure 4:
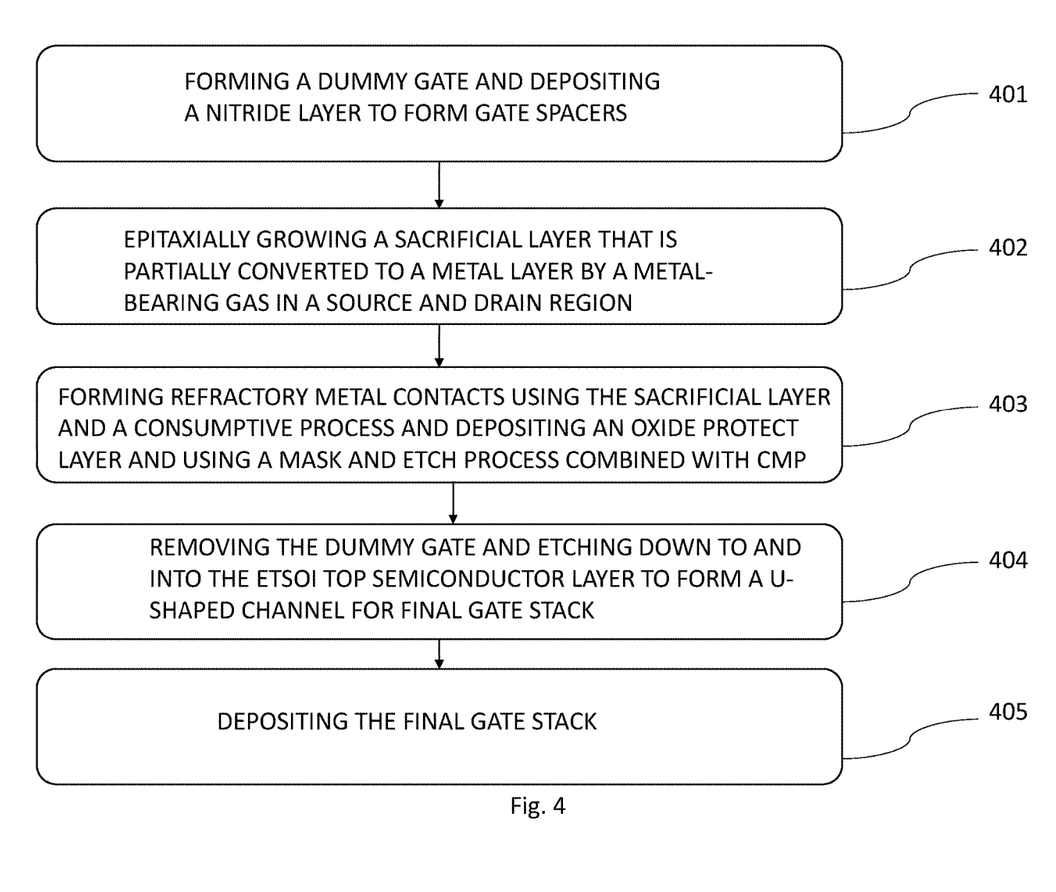
FIG. 4 illustrates a flow chart for the U-channel extremely-thin semiconductor-on-insulator (ETSOI) transistor with high performance and low resistance refractory metal contacts embodiment of FIG. 1.

FIG. 4 illustrates a flow chart of the method of fabricating the device described in FIG. 1. In 401, a dummy gate is formed and a nitride layer is deposited to form gate spacers. In 402, a sacrificial layer is epitaxially grown which will be partially converted to a metal layer by a metal-bearing gas in a source region and a drain region. In 403, refractory metal contacts are formed using the sacrificial layer and a consumptive process. Also, in 403, an oxide protect layer is deposited on the refractory metal contacts and a mask and etch process is combined with CMP. In 404, the dummy gate is removed. Also, in 404, the ETSOI top semiconductor layer is etched to form a U-shaped channel for the final gate stack. Finally, the final gate stack is deposited is 405.

In 401, the dummy gate dielectric layer 103 is preferably a nitride layer and the dummy gate mask is formed by depositing a dielectric layer, masking, and etching a cavity on top of the ETSOI wafer 101. The dummy gate is formed after CMP which planarizes the top poly/oxide surface. In 401, the gate spacers 106 are formed by depositing a nitride layer and then forming a source region and a drain region 108. The source region and the drain region can extend into ETSOI top semiconductor layer 100. In 402, the sacrificial layer can be a conductive heterostructure material such as silicon germanium or silicon carbide. Also, in 402, the metal-bearing gas can use a metal such as tungsten, aluminum, copper, molybdenum, tantalum, titanium, and nickel.

In 403, the source and drain contact metals are formed by a process where there is partial consumption of the sacrificial layer. In 403, the consumptive process is initiated by the presence of a metal-bearing gas under suitable process conditions. The refractory metal contacts 107 are then formed and the sacrificial layer is consumed. Also, in 403, an oxide protect layer is deposited on top of the refractory metal contacts 107 after CMP step is applied to planarize the top surface while revealing the top of the dummy gate.

In 404, the dummy gate is removed and the ETSOI top semiconductor layer is etched to form a U-shaped channel cavity for the final gate stack, which is deposited in 405. The U-shaped channel cavity can be formed using a reactive-ion etch (RIE) process that anisotropically etches preferentially in the vertical direction or with a wet etch or combination thereof. In 405, the final gate stack includes gate dielectrics 105 and gate metals 104 deposited into the U-shaped channel cavity. The gate dielectrics 105 and gate metals 104 can be selected to achieve the target transistor threshold voltage.

Figure 5:
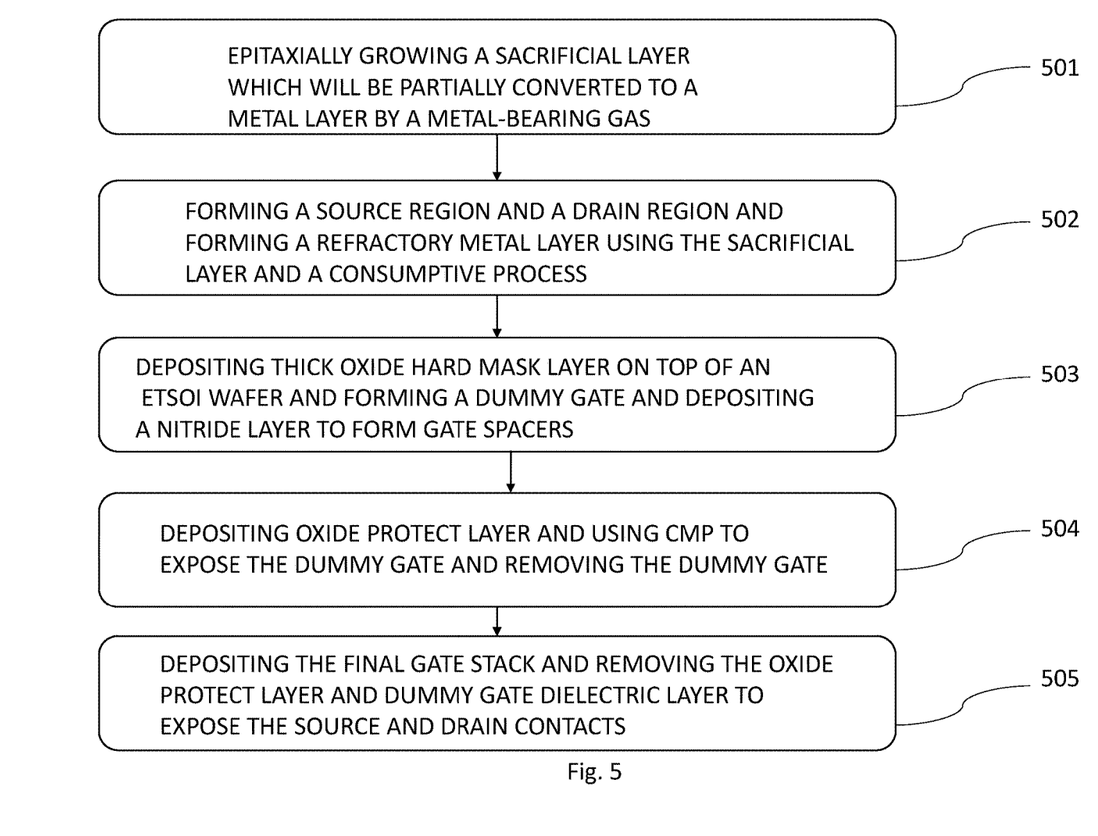
FIG. 5 illustrates a flow chart for the U-channel extremely-thin semiconductor-on-insulator (ETSOI) transistor with high performance and low resistance refractory metal contacts embodiment of FIG. 2.

FIG. 5 illustrates a flow chart of the method of fabricating the device described in FIG. 2. In 501, a sacrificial layer is epitaxially grown which will be partially converted to a metal layer by a metal-bearing gas. In 502 is forming a source region and a drain region with dopant layer and forming a refractory metal layer using the sacrificial layer and a consumptive process. In 503, a thick oxide hard mask layer on top of an ETSOI wafer is deposited. Also, in 503, a dummy gate is formed and a nitride layer is deposited to form gate spacers. In 504, an oxide protect layer is deposited and using CMP to expose the dummy gate and removing the dummy date is performed. Finally, the final gate stack is deposited and the oxide protect layer and dummy gate dielectric layer is removed to expose the source and the drain contacts in 505.

In 501, the sacrificial layer can be a conductive heterostructure material such as silicon germanium or silicon carbide. Also, in 501, the metal-bearing gas can use a metal such as tungsten, aluminum, copper, molybdenum, tantalum, titanium, and nickel. Tungsten hexafluoride is currently the preferred material used for a CVD process. In 502, a source region and a drain region with dopant 208 is introduced in the ETSOI top semiconductor layer 100 prior to the process step of epitaxially growing sacrificial layer and the forming of the refractory metal contact layer. The sacrificial layer can be a conductive heterostructure material. This conductive heterostructure material can be silicon germanium or silicon carbide.

In 503, gate spacers 106 can be formed by depositing a nitride layer on top of the dummy gate dielectric layer 103. In 504, an oxide protect layer is deposited on top of the dummy gate dielectric layer 103 and gate spacers 106 and planarizing the top surface. In 505, a final gate stack including gate dielectrics 105 and gate metals 104 deposited into the cavity, and the oxide protect layer is removed.

Figure 6:
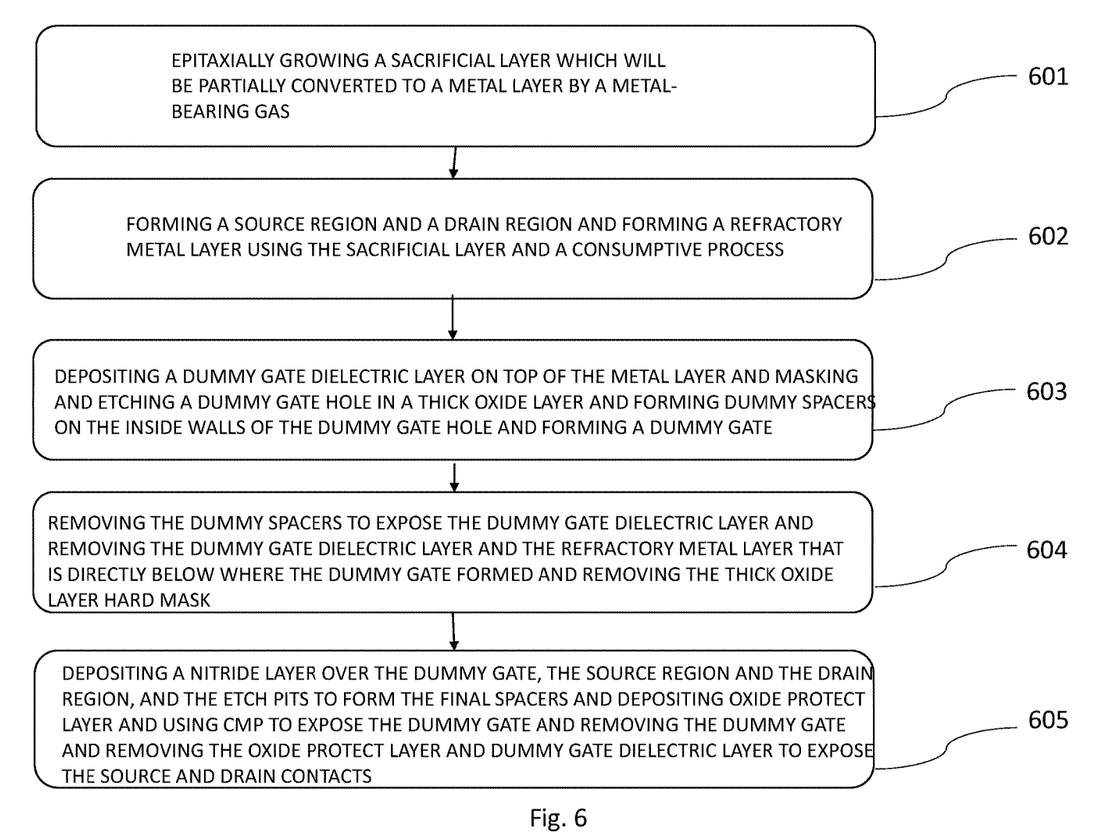
FIG. 6 illustrates a flow chart for the U-channel extremely-thin semiconductor-on-insulator (ETSOI) transistor with high performance and low resistance refractory metal contacts embodiment of FIG. 3.

FIG. 6 illustrates a flow chart of the method of fabricating the device described in FIG. 3. In 601, a sacrificial layer is epitaxially grown which will be partially converted to a metal layer by a metal-bearing gas. In 602 a source region and a drain region with dopant layer is formed. Also, in 602, a refractory metal layer is formed using the sacrificial layer and a consumptive process. In 603, a dummy gate dielectric layer is deposited on top of the metal layer. Also, in 603 masking and etching a cavity in a dielectric layer and forming dummy spacers on the inside walls of the cavity and forming a dummy gate is performed.

In 604, the dummy spacers are removed to expose the dummy gate dielectric layer. Also, in 604 the dummy gate dielectric layer is removed and the refractory metal layer that is directly below where the dummy gate is formed. In 604, the dielectric layer hard mask is removed. In 605, a nitride layer is deposited over the dummy gate, a source region and a drain region, and the etch pits to form the final spacers. Also, in 605 an oxide protect layer is deposited on the refractory metal contacts and CMP is used to expose the dummy gate. Additionally, in 605 the dummy gate is removed and the oxide protect layer is removed so that dummy gate dielectric layer exposes the source and drain contacts.

In 601, an epitaxially-grown sacrificial layer is deposited on top of the ETSOI wafer 101. Preferably the epitaxially-grown layer is silicon germanium. In 602, a source region and a drain region with dopant 308 is formed in the ETSOI top semiconductor layer 100 prior to the process step of epitaxially growing sacrificial layer and the forming of the refractory metal contact layer 307. The sacrificial layer can be a conductive heterostructure material such as silicon germanium or silicon carbide.

In 603, a dummy gate dielectric layer is deposited on top of the ETSOI wafer 101 and a dielectric layer is deposited on top of the dummy gate dielectric layer. The dielectric layer can be a thick oxide layer. In 603, a wide cavity is etched in the dielectric layer, where the width of the wide cavity is wider than the final gate. The dummy gate dielectric layer can be a nitride layer. In 604, the dummy gate dielectric layer is removed and the refractory metal layer 307 are now directly below where the dummy gate spacers 106 used to be.

In 605, the dielectric layer hard mask is etched. Then, a material for a final spacer layer is deposited over the dummy gate, source region and drain region 308, and the small etch pits form. Also, an anisotropic etch is performed to complete the formation of the final gate spacers. It is understood that this spacer formation process may not by design fill all gaps (such as the etch pits) and that gaps such as these can be a desirable electrical property of this structure.

Although illustrative embodiments of the present invention have been described herein, it is to be understood that the invention is not limited to those precise embodiments, and that various other changes and modifications may be made by one skilled in the art without departing from the scope of the invention.

The corresponding structures, materials, acts, and equivalents of all means or step plus function elements in the claims below are intended to include any structure, material, or act for performing the function in combination with other claimed elements as specifically claimed. The described embodiments of the present invention have been presented for purposes of illustration and description, but is not intended to be exhaustive or limited to the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The flowchart and block diagrams in the figures illustrate the functionality and operation of possible implementations of systems and methods according to various embodiments of the present invention. In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. The actions can be performed in a differing order or actions can be added, deleted or modified. Also, the term "coupled" describes having a signal path between two elements and does not imply a direct connection between the elements with no intervening elements/connections therebetween. All of these variations are considered a part of the invention.

The terms "about," "substantially" and equivalents thereof are intended to include the degree of error associated with measurement of the particular quantity based upon the equipment available at the time of filing the application. For example, "about," "substantially" and equivalents thereof can include a range of ±8% or 5%, or 2% of a given value.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present invention has been described in detail in connection with only a limited number of embodiments, it should be readily understood that the present invention is not limited to such disclosed embodiments. Rather, the present invention can be modified to incorporate any number of variations, alterations, substitutions or equivalent arrangements not heretofore described, but which are commensurate with the spirit and scope of the present invention. Additionally, while various embodiments of the present invention have been described, it is to be understood that aspects of the present invention can include only some of the described embodiments. Accordingly, the present invention is not to be seen as limited by the foregoing description, but is only limited by the scope of the appended claims.

What is claimed is:

1. A method of fabricating a semiconductor device comprising:
    forming nitride gate spacers adjacent to a dummy gate located on an ETSOI layer;
    growing a sacrificial layer on the ETSOI layer, the sacrificial layer comprising a material that is able to be converted to a metal layer by a metal-bearing gas;
    forming refractory metal contacts from the sacrificial layer by introducing the metal-bearing gas to the sacrificial layer, wherein forming the refractory metal contacts additionally forms a vertically graded layer in a top layer of the ETSOI layer;
    depositing an oxide protect layer on the refractory metal contacts;
    removing the dummy gate using a mask and etch process combined with chemical-mechanical polishing (CMP);
    etching the ETSOI layer to form a U-shaped channel that extends below the vertically graded layer; and
    depositing a final gate stack into the U-shaped channel.

2. The method of claim 1, wherein the U-shaped channel is doped through an open cavity prior to depositing the final gate stack.

3. The method of claim 1, wherein the refractory metal contacts are selected from a group consisting of tungsten, tantalum, platinum, molybdenum, iridium, and niobium.

4. The method of claim 1, further comprising monitoring the formation of the refractory metal contacts by measuring at least one of a concentration, a partial pressure, and an amount of reaction products formed during the sacrificial layer consumptive process.

5. The method of claim 1, wherein the sacrificial layer has a nonplanar structure prior to forming the refractory metal contacts.

6. The method of claim 1, further comprising forming a source region and a drain region, wherein a drive-in anneal process is applied to facilitate dopant diffusions.

7. The method of claim 1, wherein the sacrificial layer is fully converted to a metal layer by a metal-bearing gas.

8. The method of claim 1, wherein the dummy gate is polished back to leave a planar top surface.

9. The method of claim 1, wherein the source region and the drain region is formed within the exposed ETSOI layer adjacent to the final gate stack.

10. The method of claim 1, wherein the oxide protect layer is removed after the final gate stack is formed.

* * * * *